(12) United States Patent
Holthuizen et al.

(10) Patent No.: US 8,076,937 B2
(45) Date of Patent: Dec. 13, 2011

(54) FIBRE TRACKING ON THE BASIS OF MACROSCOPIC INFORMATION

(75) Inventors: Ronaldus Frederik Johannes Holthuizen, Eindhoven (NL); Frank Hoogenraad, Eindhoven (NL); Arianne Van Muiswinkel, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 310 days.

(21) Appl. No.: 12/517,568

(22) PCT Filed: Dec. 6, 2007

(86) PCT No.: PCT/IB2007/054947
§ 371 (c)(1),
(2), (4) Date: Jun. 4, 2009

(87) PCT Pub. No.: WO2008/072142
PCT Pub. Date: Jun. 19, 2008

(65) Prior Publication Data
US 2010/0079140 A1      Apr. 1, 2010

(30) Foreign Application Priority Data
Dec. 11, 2006    (EP) .................................. 06125790

(51) Int. Cl.
*G01V 3/00*    (2006.01)
(52) U.S. Cl. ......................................................... 324/307
(58) Field of Classification Search ........... 324/300–322; 600/410–435
See application file for complete search history.

(56) References Cited

U.S. PATENT DOCUMENTS

| | | | | |
|---|---|---|---|---|
| 6,526,305 | B1 * | 2/2003 | Mori | 600/410 |
| 6,724,190 | B2 * | 4/2004 | van Muiswinkel et al. | 324/307 |
| 6,806,705 | B2 * | 10/2004 | van Muiswinkel et al. | 324/307 |
| 6,992,484 | B2 * | 1/2006 | Frank | 324/307 |
| 7,034,531 | B1 | 4/2006 | Tuch et al. | |
| 7,483,176 | B2 * | 1/2009 | Suzuki | 358/3.03 |
| 7,521,931 | B2 * | 4/2009 | Ogrezeanu et al. | 324/317 |
| 7,630,530 | B2 * | 12/2009 | McGraw et al. | 382/128 |
| 7,657,071 | B2 * | 2/2010 | Bartesaghi et al. | 382/128 |
| 7,834,627 | B2 * | 11/2010 | Sakai et al. | 324/318 |
| 2003/0214289 | A1 | 11/2003 | van Muiswinkel et al. | |
| 2006/0165308 | A1 | 7/2006 | Chakraborty | |
| 2006/0176488 | A1 * | 8/2006 | McGraw | 356/446 |

FOREIGN PATENT DOCUMENTS

WO    2005076030 A1    8/2005

OTHER PUBLICATIONS

Corouge, I., et al.; Towards a Shape Model of White Matter Fiber Bundles Using Diffusion Tensor MRI; 2004; IEEE Trans. on Biomedical Imaging; pp. 344-347.

(Continued)

*Primary Examiner* — Dixomara Vargas

(57) ABSTRACT

A diffusion data processing apparatus comprising a segmenter arranged to segment the diffusion tensor data according to at least one segmentation model representing at least part of a fiber bundle. The segmentation model may comprise macroscopic and/or microscopic information. This leads to a segmentation of the fiber bundle that is robust and less influenced by non-perfections of the data set, such as low signal-to-noise ratio, partial voluming, or other imaging artifacts.

20 Claims, 5 Drawing Sheets

OTHER PUBLICATIONS

Klose, U., et al.; Directional Correlation in White Matter Tracks of the Human Brain; 2004; J. of Magnetic Resonance Imaging; 20:25-30.

Merhof, D., et al.; Hybrid Visualization for White Matter Tracts using Triangle Strips and Point Sprites; 2006; IEEE Trans. on Visualization and Computer Graphics; 12(5)1181-1188.

O'Donnell, L., et al.; A High-Dimensional Fiber Tract Atlas; 2006; Proc. Intl. Soc. Mag. Reson. Med.; 14:439.

Tench, C. R., et al.; Improved White Matter Fiber Tracking Using Stochastic Labeling; 2002; MRM; 48:677-683.

* cited by examiner

FIBRE TRACKING ON THE BASIS OF MACROSCOPIC INFORMATION

FIELD OF THE INVENTION

The invention relates to a diffusion data processing apparatus.

The invention further relates to an imaging system.

The invention still further relates to a method of processing diffusion data.

The invention still further relates to a computer program.

Magnetic resonance imaging for obtaining diffusion data image (MRI-DTI) is a magnetic resonance imaging method that is sensitive to local diffusion (notably of protons, but in principle also other nuclei that have magnetic resonance properties may be used). MRI-DTI produces for individual voxels information on the main diffusion direction. Fiber tracking concerns to identify connected fibers in biological (human) neurological tissue on the basis of DTI data.

Noise (or signal-to-noise) and crossing of fibers are a source of errors in fiber tracking which uses a voxel-to-voxel approach to connect voxels to each other in correspondence with the diffusion direction.

BACKGROUND OF THE INVENTION

International Patent application publication WO 2005/076030 A1 discloses the reconstruction of an object dataset from the magnetic resonance signals in which apparent diffusion coefficients are assigned. The occurrence of one single or several diffusion directions is identified for different voxels, in order to take account of crossing fibers. The method being voxel oriented, it does not suggest or imply to employ voxel-spanning information.

US Patent Application Publication US 2006/0165308 A1 discloses a neighborhood relevance component that considers diffusion tensor matrices from neighboring pixels or voxels. The neighborhood relevance component is modeled as a Markov Random Field. Also this approach is voxel-oriented, because it assumes some kind of correlation between the diffusion data of neighboring voxels. However, this correlation can become rather weak due to strong noise.

The known apparatuses and methods reconstruct fiber tracts using microscopic information. Therefore, they are susceptible to noise, partial voluming and other imaging artifacts. There is a need for a robust apparatus and a corresponding method that is less influenced by imperfections of the dataset.

SUMMARY OF THE INVENTION

The present invention addresses the needs described above by providing a diffusion data processing apparatus comprising a segmenter arranged to segment the diffusion data according to at least one segmentation model representing at least part of a fiber bundle.

In the following, the two-dimensional case is also included, even if only the three-dimensional case is explicitly mentioned. As such, e.g. the term "voxel" that is used in the three-dimensional context corresponds to the "term" pixel in the two-dimensional context. The term "region-of-interest" addresses both, the two-dimensional and the three-dimensional case.

The data processing apparatus is supplied with diffusion data. The diffusion data could be diffusion tensor data, but also higher order diffusion data that could be acquired by means such as HARDI (high angular diffusion data), Multi-tensor fitting methods, ODF methods, or Q-ball/Q-space methods.

One model or several segmentation models are also supplied to the data processing apparatus. The one or more segmentation models represent a part of a certain fiber bundle or the entire bundle. A part of a fiber bundle may refer to a subset of the fibers that constitute the fiber bundle, or even a single fiber. A part of a fiber bundle may also refer to a limited length of the fiber bundle as opposed to the entire length of the fiber bundle. The models can be generated in a variety of ways. One option is to generate the models on the basis of anatomical studies, such as anatomic dissection. Another option is to generate the models on the basis of previous sessions involving the acquisition and processing of diffusion data.

Each model represents the corresponding fiber bundle in terms of local diffusion information, as well as the more ample spatial context of this information.

The segmenter distinguishes between fiber bundles and other matter, such as white matter of the brain. The segmenter also distinguishes among several distinct fiber bundles.

This is achieved by consecutively matching each of the models with the diffusion data. Matching may be performed e.g. by performing a correlation between the diffusion data and the model. Each model may also be translated, rotated or scaled in order to cover a wide variety of fiber bundles (or parts thereof) that may actually occur.

In order to avoid an excessive number of matching operations, implementation of a search strategy may be considered. For example, it may be considered to start with relatively coarse models that roughly indicate the position, orientation and size of relevant structures within the diffusion data. Depending on the result produced by the coarse models, the search proceeds with models that are gradually finer. These finer models correspond to those coarser models that scored high in their matching with the presented diffusion data (or a part thereof). It may also be contemplated to analyze the presented diffusion data with respect to regions of interest. For example, a region in the presented diffusion data that shows no or only weak anisotropy is unlikely to contain a fiber bundle and may be left unconsidered during the search.

Once a segmentation model of a fiber bundle is found that is similar to the diffusion data, this model is retained. Accordingly, the data processing apparatus segments the fiber bundle by finding the segmentation model that performs the best match with the underlying data.

The data processing apparatus performs a true segmentation, because the segmentation does not depend on a selected starting point. Furthermore, the segmentation typically shows the entire fiber bundle or fiber bundle part that is represented by the fitted segmentation model. Another feature of segmentation is the fact that it typically uses information of surrounding voxels and the shape of the object. This usually leads to accurately segmented objects which in the present case are fibers or fiber bundles.

The segmentation model may comprise macroscopic information with respect to the fiber bundle. The term "microscopic" relates to local information, and more particularly to voxel-wise information. The term "macroscopic" relates to non-local information. The segmentation model may for example represent the course of a fiber bundle in the three-dimensional space. The segmentation model could also indicate certain regions within the brain through which the fiber bundle is likely to pass, such as the origin of the fiber bundle and its destination. The macroscopic information could be presented in the form of parameters of the segmentation model.

The macroscopic data may be individually or in combination selected from the group consisting of shape constraints of the segmentation model parallel to the fiber bundle direction, shape constraints of the segmentation model perpendicular to the fiber bundle direction, general shape constraints of the segmentation model, a-priori knowledge of the shape of the particular fiber bundle, and a-priori knowledge of diffusion data.

Shape constraints of the segmentation model parallel to the fiber bundle direction may be for example the following: minimum/maximum length, curvature, branching/kissing, narrowing/widening, crossing. Also the course of the fiber bundle may be considered as a shape constraint of the segmentation model parallel to the fiber bundle direction.

Shape constraints of the segmentation model perpendicular to the fiber bundle direction may be for example the following: minimum/maximum fiber width/diameter, cross section curvature, whether to allow "holes" in the fiber. Also the shape of the cross section of the fiber bundle may be considered as a shape constraint of the segmentation model perpendicular to the fiber bundle direction.

General shape constraints of the fiber bundle may be for example non-circular character of fibers and minimum/maximum branch length.

A-priori knowledge of the shape of the particular fiber bundle that is being searched may be used as information to improve segmentation results. It may also be used to enable fully automatic detection of the fiber bundles of the brain without prior input by the user concerning starting locations and regions-of-interest.

The model may comprise microscopic information with respect to the fiber bundle. The microscopic information could also be presented in the form of parameters of the segmentation model.

The microscopic information may be individually or in combination selected from the group consisting of fiber bundle direction, fractional anisotropy, a-priori knowledge of diffusion data, and the amount of coherence in direction of the underlying data in the perpendicular plane of the fiber direction. Matching of the model and the underlying data is assured, among others, by the microscopic information that is available in both, the model and the underlying data. Different criteria can be identified and defined for the core of the fiber bundle and the periphery of the fiber bundle.

The diffusion data processing apparatus may further comprise
 a fiber-contents-per-voxel determiner;
 a region-of-interest determiner.

The fiber-contents-per-voxel determiner may also be regarded as an analyzer suitable for performing the function of determining fiber contents per voxel. The region-of-interest determiner may also be regarded as an analyzer suitable for performing the function of determining regions of interest.

The fiber-contents-per-voxel determiner performs a pre-processing of the underlying data. Various different methods can be used that can determine the fiber contents per voxel using data that pertains to the considered voxel. Some of these methods are:
 Single tensor fiber fitting;
 multi-tensor and/or multi-fiber fitting;
 ODF (Orientation Distribution Function)/Q-ball type methods to calculate the fiber content;
 combining lower resolution DTI data and higher resolution, from which the presence of white matter can be determined. Various techniques exist that extract white matter from not Diffusion data, described in e.g. "Fractional Segmentation of White Matter" by Warfield et al., Proceedings of MICCAI'99, page 62. The combination of using diffusion data and one or more other maps for determining white matter is a new technique.

On the voxel scale, it is known to fit a fiber model to the measured data. Per-voxel information is used to calculate the single or multiple fiber contents. However, depending on the acquisition used, sometime more than one fiber configuration matches with the measured data. Current methods try to best determine the fiber contents by improving the fiber model. However, since macroscopic data is used later in the fiber reconstruction algorithm, it is possible to take into account multiple possible configurations, and optionally their likelihood. Later non-local information can be used to determine the most likely configuration of the local data. This is also true for multi-tensor, and other types of models.

Other currently known techniques used in fiber tracking/reconstruction.

The determination of regions of interest involves distinguishing between one or more areas that are considered to be (at least partially) part of the fiber of interest, and zero or more areas that are not considered to be part of the fiber of interest. Typically, the fiber must pass through all one or more "include" regions of interest, and may not pass through any of the "exclude" regions of interest. Optionally, it is possible to define Boolean logic for the regions of interest, e.g. (ROI_1 OR ROI_2) AND NOT (ROI_3). This example means that the fiber must pass through ROI_1 and ROI_2, but may not pass through ROI_3.

Between the fiber-contents-per-voxel determiner and the region-of-interest determiner, an optional mask and statistics calculator may be interposed. The mask and statistics calculator speeds up the performance of subsequent processing units. Various microscopic and macroscopic statistics can be used by the fitting algorithm to reconstruct the fiber. By optionally pre-calculating possible values per voxel (or per voxel depending on the locally relevant known fiber, or per voxel depending on the direction of the reconstructed fiber), the performance of the segmenter can be improved significantly.

Furthermore, the data processing apparatus may comprise a model visualizer that facilitates visualization of the segmented fiber by using 3D or 2D rendering techniques.

Still further more, the data processing apparatus may comprise a report generator. The generated report may comprise 1 or more fiber models, visualizations thereof, and statistical information. In addition to the standard automatic reporting that is already available (mean fractional anisotropy of the fiber, mean ADC (Apparent Diffusion Coefficient), etc.) additional properties of the fiber are calculated during the modeling process. Many of these properties give useful insights into the anatomy of the segmented fiber, and can thus be reported automatically. In particular, the report may contain quantitative information of the fiber. This information can be put automatically in reports by the report generator for easy workflow analysis. Information that could be used is: Average fractional anisotropy (FA) of the fiber, average apparent diffusion coefficient (ADC), width of the fiber, curvature of the fiber, spread of the fiber, length of the fiber, or circularity of the fiber. Also the type of the used fiber model and its properties (such as the typical age, weight, or diagnostic findings of patients from whom the fiber model was deducted) can be reported.

The diffusion data processing apparatus may be comprised in an imaging system. This assures seamless integration with the rest of the system.

The present invention addresses the needs described in the introduction and prior art section by providing a method of processing diffusion data. The method comprises segmenting the diffusion data according to at least one segmentation model representing at least part of a fiber bundle.

Diffusion data is used as input data for the method. The diffusion data could be diffusion tensor data, but also high angular diffusion data that is acquired by means of Multi-tensor fitting methods, ODF methods or Q-ball methods.

Another input data for the method is/are one segmentation model or several segmentation models. The one or more segmentation models represent a part of a certain fiber bundle or the entire bundle. A part of a fiber bundle may refer to a subset of the fibers that constitute the fiber bundle, or even a single fiber. A part of a fiber bundle may also refer to a limited length of the fiber bundle as opposed to the entire length of the fiber bundle. The models can be generated in a variety of ways. One option is to generate the models on the basis of anatomical studies, such as anatomic dissection. Another option is to generate the models on the basis of previous sessions involving the acquisition and processing of diffusion data.

Each model represents the corresponding fiber bundle in terms of local diffusion information, as well as the more ample spatial context of this information.

Segmenting within the method distinguishes between fiber bundles and other matter, such as white matter of the brain. Segmenting within the method also distinguishes among several distinct fiber bundles.

This is achieved by consecutively matching each of the models with the diffusion data. Matching may be performed e.g. by performing a correlation between the diffusion data and the model. Each model may also be translated, rotated or scaled in order to cover a wide variety of fiber bundles (or parts thereof) that may actually occur.

In order to avoid an excessive number of matching operations, implementation of a search strategy may be considered. For example, it may be considered to start with relatively coarse models that roughly indicate the position, orientation and size of relevant structures within the diffusion data. Depending on the result produced by the coarse models, the search proceeds with models that are gradually finer. These finer models correspond to those coarser models that scored high in their matching with the presented diffusion data (or a part thereof). It may also be contemplated to analyze the presented diffusion data with respect to regions of interest. For example, a region in the presented diffusion data that shows no or only weak anisotropy is unlikely to contain a fiber bundle and may be left unconsidered during the search.

Once a segmentation model of a fiber bundle is found that is similar to the diffusion data, this model is retained. Accordingly, the method segments the fiber bundle by finding the segmentation model that performs the best match with the underlying data.

The method performs a true segmentation, since the segmentation does not depend on a selected starting point. Furthermore, the segmentation typically shows the entire fiber bundle (or a part thereof) that is represented by the fitted segmentation model. Another feature of segmentation is the fact that it typically uses information of surrounding voxels and the shape of the object. This usually leads to accurately segmented objects which in the present case are fibers or fiber bundles.

The segmentation model may comprise macroscopic information with respect to the fiber bundle.

The method may further comprise
determining fiber-contents per voxel;
determining at least on region of interest.

The present invention addresses the needs described in the introduction and prior art section also by providing a computer program comprising instructions for causing a processor to carry out the method as previously described.

Technical features of the data processing apparatus may also be applicable to the method and the computer program and vice versa.

DETAILED DESCRIPTION OF THE EMBODIMENTS

Figure 1:
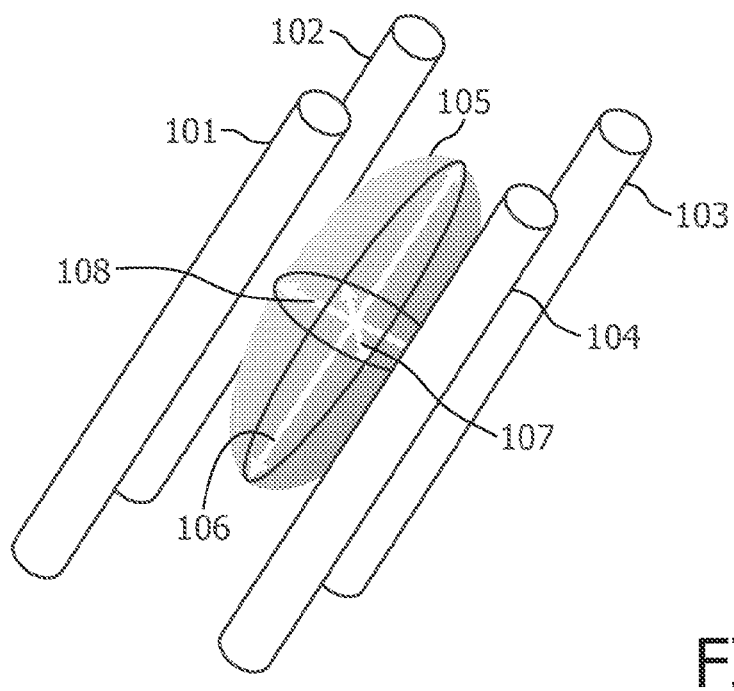
FIG. 1 is a schematic drawings showing the basic properties of diffusion in a fiber bundle.

In FIG. 1, the basic properties of diffusion measurement are illustrated. Diffusion is measured in at least six directions (three-dimensional case). From the diffusion measurements a symmetrical real-valued tensor can be constructed from which the eigenvectors and eigenvalues are calculated. FIG. 1 shows four idealized fibers 101 to 104. The diffusion tensor is illustrated as an ellipsoid 105 in FIG. 1. The diffusion tensor has a major eigenvector 106, a minor eigenvector 107, and a medium eigenvector 108. In the presence of fibers or a fiber bundle, diffusion is typically restricted substantially to one direction, i.e. the diffusion is anisotropic. Therefore, the structure and the course of fibers can be deducted from the data of the diffusion tensor.

Figure 2:
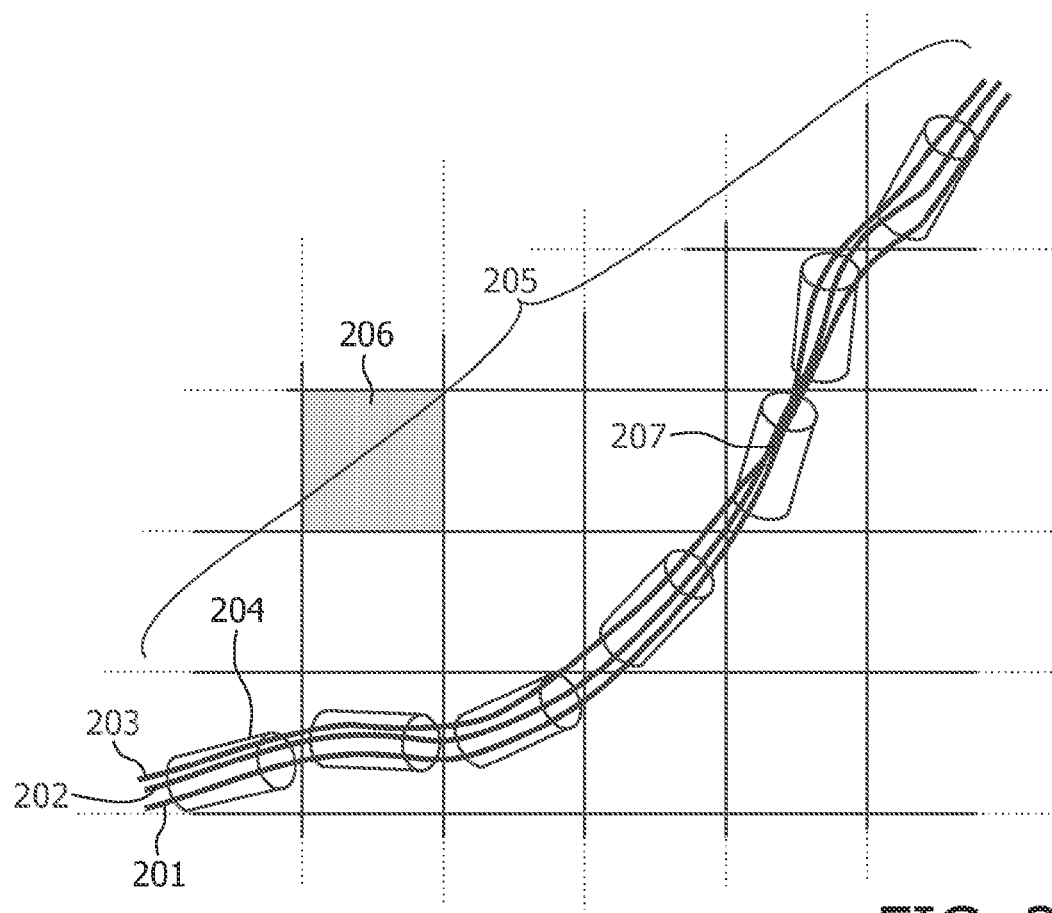
FIG. 2 is a schematic drawing illustrating a fiber bundle and a corresponding segmentation model.

FIG. 2 shows the relation between a segmentation model and actually acquired data (i.e. real-life data). FIG. 2 shows a grid illustrating the discretization of the acquisition volume. Only a part of the acquisition volume is represented. For illustrative purposes, one voxel 206 of the acquisition volume is also represented.

Three fibers 201, 202, and 203 form a fiber bundle and represent actually acquired data. A segmentation model 205 comprises a plurality of segmentation model divisions, one of which is labeled with reference sign 204. Each segmentation division is assigned to a voxel. However, not every voxel has a segmentation model part assigned to it. Each segmentation model division defines the diffusion in the voxel that it is assigned to. Furthermore, several adjacent segmentation model divisions also define the course of the segmentation model and the spatial relationship among the divisions. Since the segmentation model 205 is intended to model a fiber bundle, it is capable of taking fiber crossings into consideration, such fiber crossing 207. Fiber crossing 207 occurs within the same fiber bundle.

Figure 3:
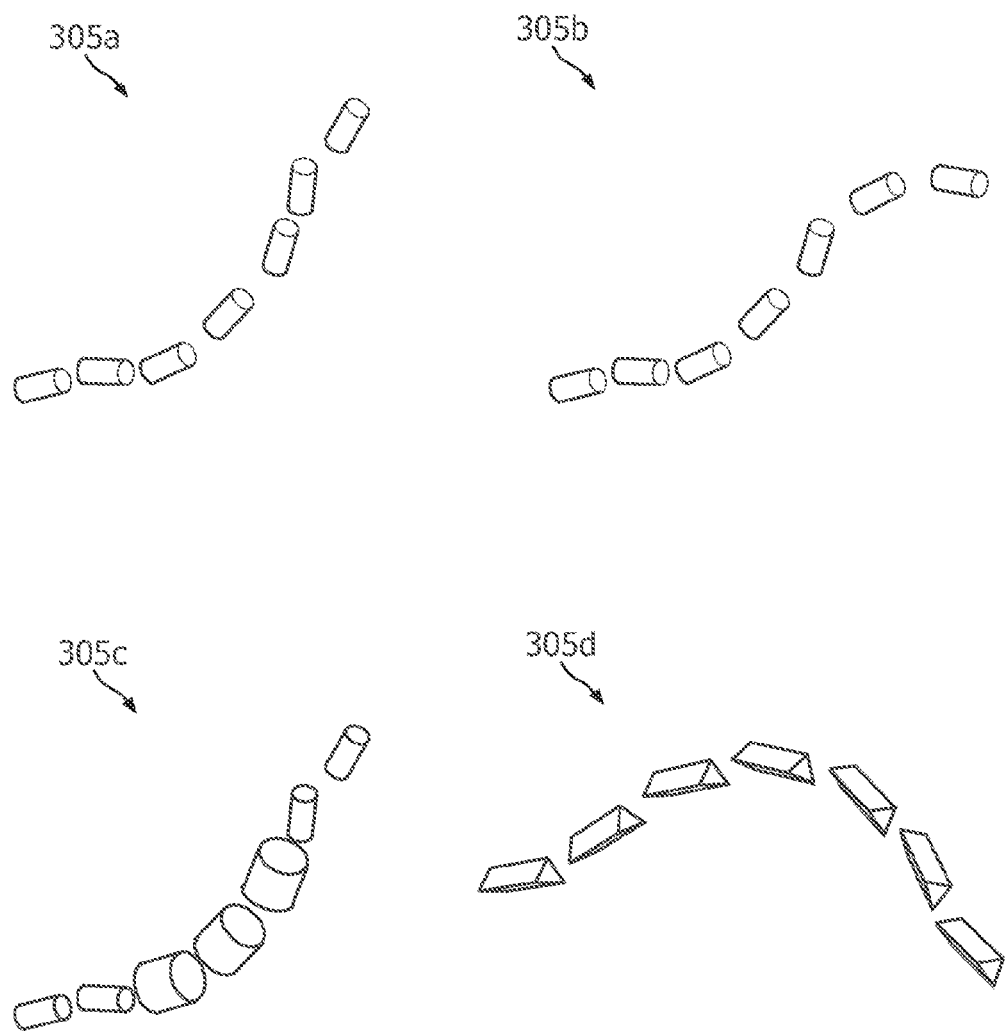
FIG. 3 shows a selection of different segmentation models.

FIG. 3 shows four examples of segmentation models 305a to 305d. The first exemplary segmentation model 305a features a slight curve and a constant, circular cross section. The second segmentation model 305b is largely similar to the first segmentation model 305a, except for the course that it follows. In contrast, the third segmentation model 305c follows the same course as the first segmentation model 305a. However, the cross section of the third segmentation model 305c is not constant over the length of the segmentation model. Finally, the fourth segmentation model 305d features a distinctive course and a distinctive cross section (triangular cross section for illustrative purposes, only).

Figure 4:
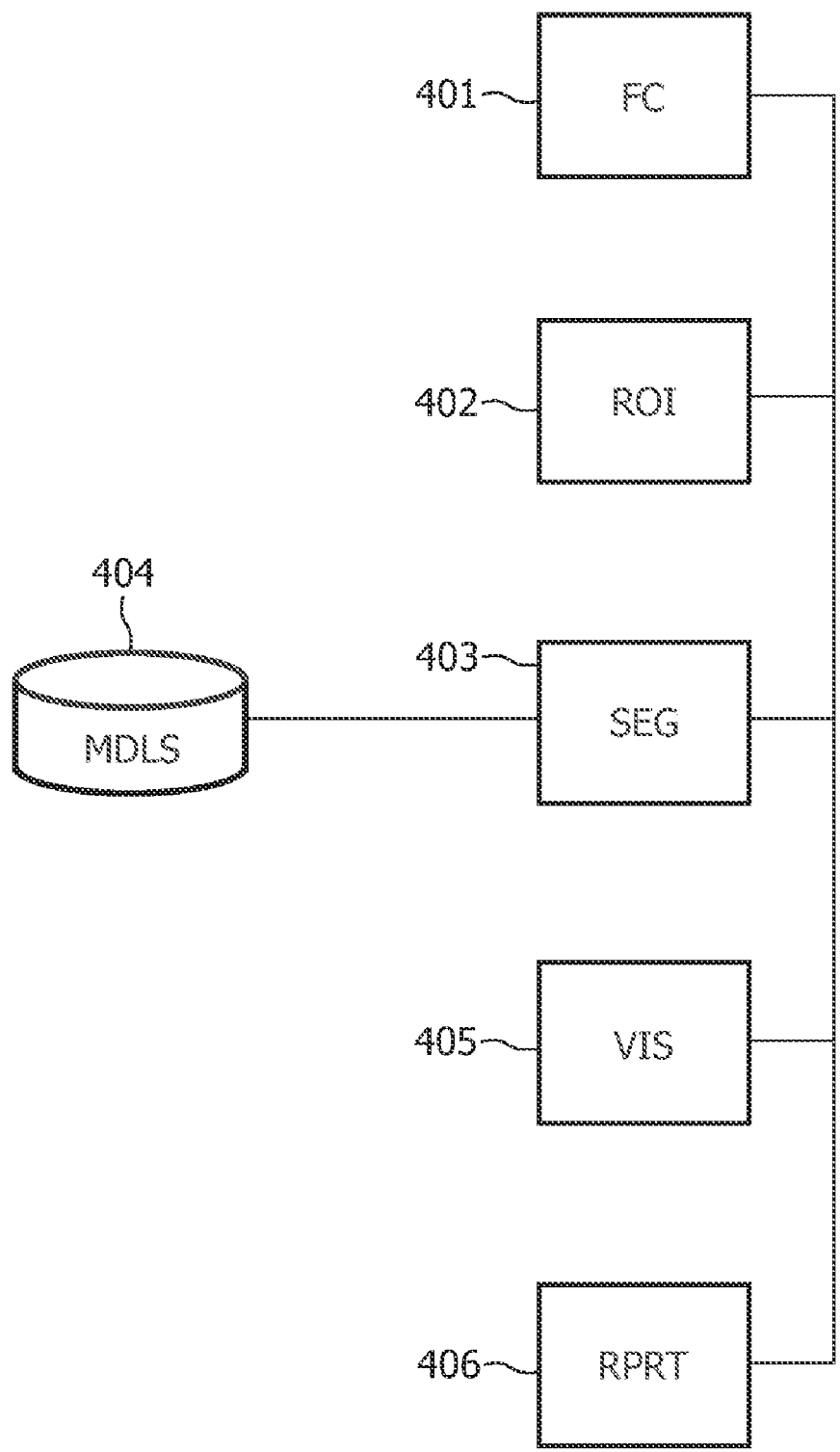
FIG. 4 is a schematic diagram showing the data processing apparatus and various peripherals and sub-entities.

FIG. 4 illustrates some components of the data processing apparatus. Some of the components that are shown are a determiner for fiber contents per voxel 401 (also identified by "FC", short for "Fiber Contents", for easier reference), a determiner for regions of interest 402 ("ROI" for "Region(s) Of Interest"), a segmenter 403 ("SEG" for "SEGmenter"), a visualizer 405 ("VIS" for "VISualizer"), and a report generator 406 ("RPRT" for "RePoRT generator"). These components are connected to each other e.g. by means of a bus. However, other techniques of connecting the components with each other may also be contemplated. The segmenter 403 also has a connection to a database of segmentation models 404 ("MDLS" for "MoDeLS"). Segmentation models for the various types of fiber bundles that can be found in the human brain are stored in this database. During operation, the segmenter 403 retrieves segmentation models from the database and compares each of the retrieved segmentation models with the actual data. If the models are segmentation models that are elastically deformable, the segmenter attempts to deform the current segmentation model in order to achieve an improved fit of the current segmentation model to the data. The retrieval of segmentation models may be performed sequentially. However, in order to improve the performance of the segmenter, it may also be considered to perform a hierarchical search. The hierarchical search yields a reduced number of segmentation models that appear to resemble the underlying data. This reduces the number of the matching operations between segmentation models and underlying data which typically are CPU-intensive.

The illustration of the components in FIG. 4 is only schematic and with emphasis on the respective functions of the components. In particular, some or all of the components may be combined in a single entity, such as a processor, or memory. On the other hand, some components may be incorporated in another system. For example, the visualizer 405 and the report generator 406 may be independent from the rest of the components and retrieve the data to visualize or to establish a report upon from an archiving system, for example. In this case, the segmenter 403 previously writes the segmentation results to the archiving system.

FIG. 4 may also be interpreted in terms of software modules. Each of the functions of the determiner for fiber contents per voxel 401, the determiner for regions of interest 402, the segmenter 403, and the report generator 406 may be implemented in form of software, notably in the form of software packages that upgrade already installed software. The upgrade enables an installed magnetic resonance imaging system to also operate according to the present invention.

Figure 5:
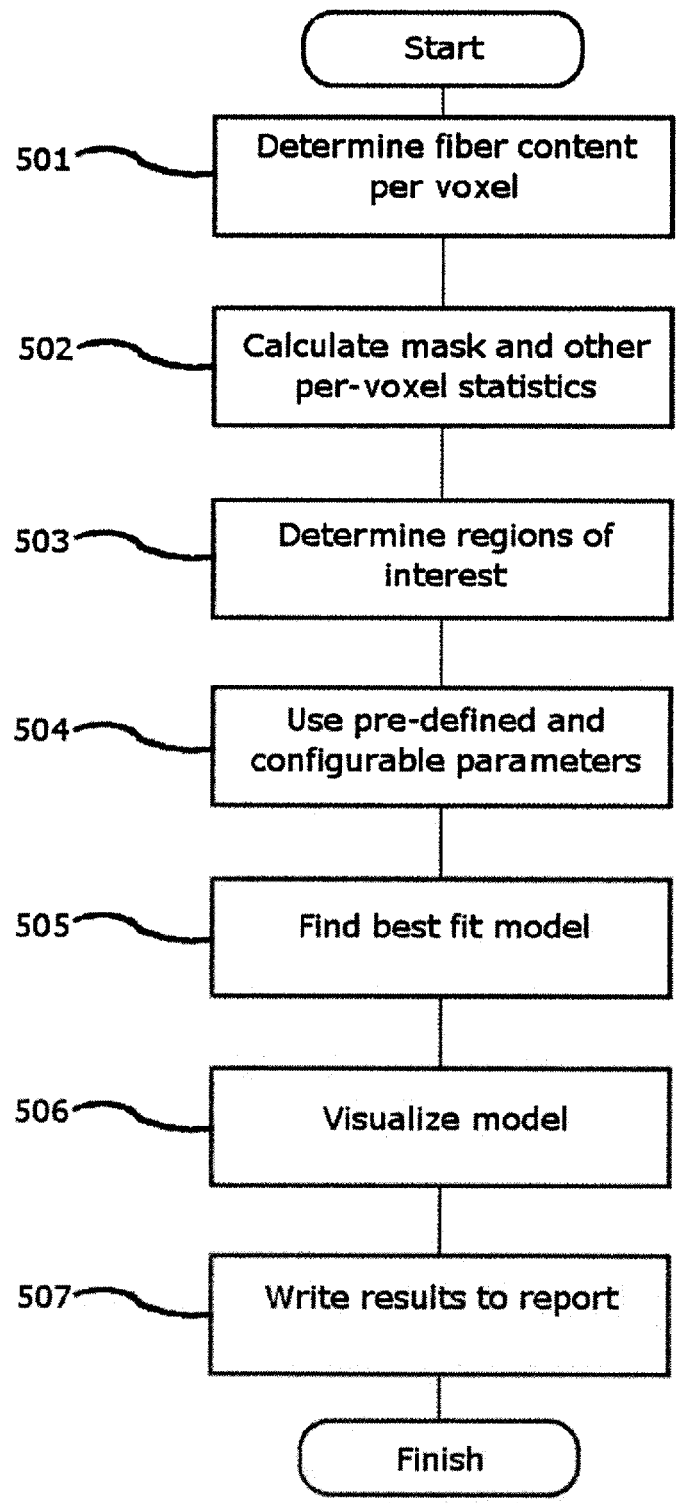
FIG. 5 is a flow chart showing an exemplary segmentation and corresponding pre- and post-processing.

FIG. 5 shows a flow chart of the method as claimed herein. Block 501 represents the activity of determining fiber contents per voxel. Block 502 represents an optional activity of calculating a mask and other per-voxel statistics to speed up the performance of later activities. Block 503 represents the activity of determining regions of interest, consisting of one or more areas that are considered to be (at least partially) part of the fiber (bundle) of interest, and zero or more areas that are considered to be entirely not part of the fiber (bundle) of interest. Block 504 represents the activity of using pre-defined, or configurable parameters that describe macroscopic and microscopic properties of the fiber (bundle) to be reconstructed. Block 505 represents the activity of finding the best fit of a model. This activity possibly makes use of the regions of interest and the parameters. Block 506 represents the activity of visualizing the model. Block 507 represents the activity of writing results or a report consisting of one or more fiber (bundle) models, visualizations thereof, and statistical information.

Figure 6:
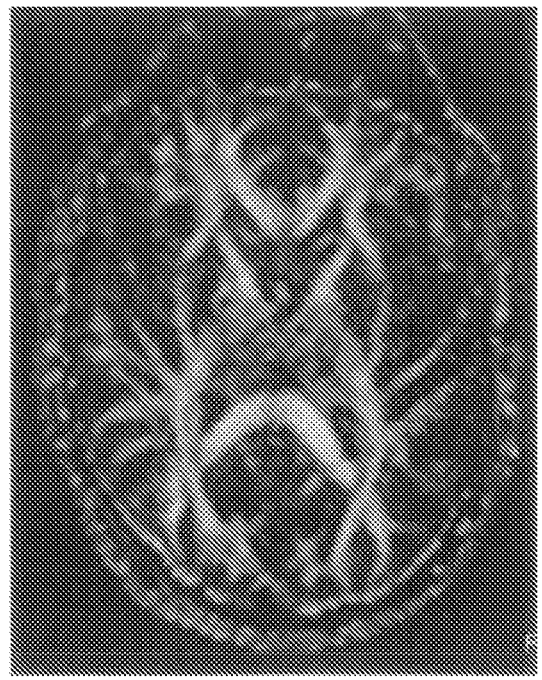
FIG. 6 is a fractional anisotropy image.
Figure 7:
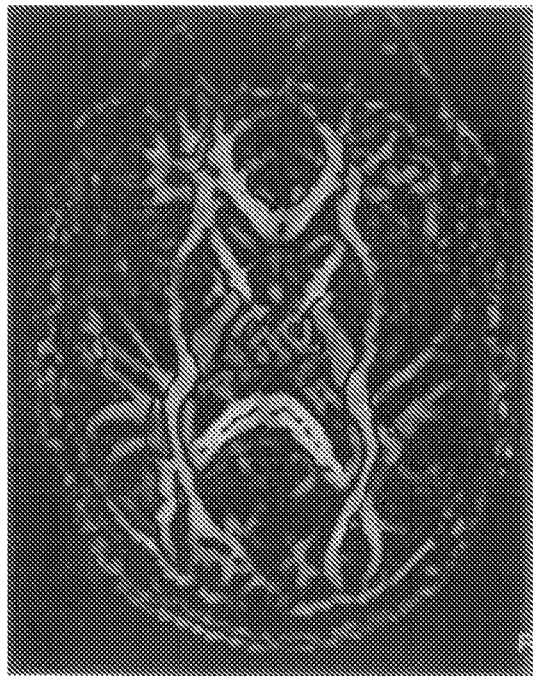
FIG. 7 is the fractional anisotropy image of FIG. 5 after being filtered.

FIGS. 6 and 7 show an example of the results that can be expected from the invention. FIG. 6 is a single color fractional anisotropy image of a human brain viewed from the top. FIG. 7 shows the same image, but after having undergone image processing. The image processing includes applying a standard image filter of an off-the-shelf graphics software package to visualize the potential of macroscopic information for segmenting fibers using a single color fractional anisotropy (FA) image. It is assumed that the filter has an edge-detection step, where edges have certain criteria. The edges are marked as "black" in the input image to visualize the edges. The filter is capable of segmenting a significant portion of the fibers of the image, without using any knowledge of diffusion or diffusion properties, but by solely performing an edge-type detecting by looking at the fibers and the surroundings of the fibers. The segmented image gives a good impression of the enhancements of using this approach. In addition, the segmentation was performed without all kinds of other types of information that is available to the dedicated fiber segmentation algorithm that is proposed.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

The invention claimed is:

1. A diffusion data processing apparatus comprising:
a fiber contents processor arranged to determine the fiber contents per voxel of diffusion data generated by a diagnostic imaging device;
a region of interest processor arranged to determine a region of interest in the diffusion data; and
a segmentation processor arranged to segment said diffusion data according to at least one segmentation model representing at least part of a fiber bundle to obtain a best fit model of the segmentation model to the fiber contents, the segmentation model including a plurality of segmentation model divisions, each division corresponding to a voxel.

2. The diffusion data processing apparatus of claim 1, wherein said segmentation model includes macroscopic information with respect to said fiber bundle.

3. The diffusion data processing apparatus of claim 2, wherein said macroscopic information is individually or in combination selected from the group consisting of:
shape constraints of the segmentation model parallel to the fiber bundle direction,
shape constraints of the segmentation model perpendicular to the fiber bundle direction,
general shape constraints of the segmentation model,
a-priori knowledge of the shape of said particular fiber bundle, and
a-priori knowledge of diffusion data.

4. The diffusion data processing apparatus of claim 1, wherein said model includes microscopic information with respect to said fiber bundle.

5. The diffusion data processing apparatus of claim 4, wherein said microscopic information is individually or in combination selected from the group consisting of:
fiber bundle direction,
fractional anisotropy,
a-priori knowledge of diffusion data, and
the amount of coherence in direction of the underlying data in the perpendicular plane of the fiber direction.

6. The diffusion data processing apparatus of claim 1, wherein the segmentation processor elastically deforms the best fit; segmentation model in order to determine an improved fit for the diffusion data.

7. The diffusion data processing apparatus of claim 1, further comprising:
a report generator.

8. An imaging system comprising:
a magnetic resonance imaging apparatus; and
the diffusion data processing apparatus according to claim 1.

9. The apparatus of claim 1 wherein at least one of the segmentation models is based at least in part on an anatomical dissection.

10. A method of processing diffusion data, said method comprising:
with a processor, segmenting said diffusion data acquired from a magnetic resonance imaging apparatus including retrieving segmentation models representing at least part of a fiber bundle from a segmentation model data base and comparing the diffusion data with the retrieved segmentation models to determine a best fit model;
presenting at least one of the best fit diffusion model and diffusion information from the best fit diffusion model in a report or on a display device.

11. The method of claim 10, said segmentation models comprising macroscopic information with respect to said fiber bundle.

12. The method of claim 10, further comprising:
determining fiber-contents per-voxel;
determining at least one region-of-interest.

13. A non-transitory computer readable medium carrying software for controlling a processor to carry out the method of claim 10.

14. The method of claim 10 wherein the segmentation models are based on prior anatomical studies.

15. A magnetic resonance imaging apparatus comprising:
a magnetic resonance imaging scanner for obtaining diffusion data sensitive to local diffusion;
a database of segmentation models for various types of fiber bundles; and
a segmentation processor that retrieves the segmentation models from the database and compares each segmentation model with the diffusion data in order to determine a best fit segmentation model.

16. The apparatus of claim 15 wherein the segmentation processor elastically deforms the best fit segmentation model in order to improve a fit of the best fit model to the diffusion data.

17. The apparatus of claim 15 wherein the segmentation processor uses a mask to mask areas which correspond to white matter.

18. The apparatus of claim 15 wherein the segmentation processor uses a hierarchical search to select the best fit segmentation model from the segmentation models.

19. The apparatus of claim 15 wherein the segmentation models include at least one of macroscopic information and microscopic information.

20. The apparatus of claim 15 further including:
an output device which outputs a report including at least one of the best fit model and information derived from the best fit model.

* * * * *